United States Patent
Obu et al.

(10) Patent No.: US 9,293,323 B2
(45) Date of Patent: Mar. 22, 2016

(54) METHOD OF FORMING SILICON FILM

(71) Applicant: TOKYO ELECTRON LIMITED, Minato-ku, Tokyo (JP)

(72) Inventors: Tomoyuki Obu, Nirasaki (JP); Takahiro Miyahara, Nirasaki (JP); Tomoyuki Nagata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 66 days.

(21) Appl. No.: 14/141,620

(22) Filed: Dec. 27, 2013

(65) Prior Publication Data
US 2014/0187025 A1  Jul. 3, 2014

(30) Foreign Application Priority Data
Dec. 27, 2012  (JP) .................................. 2012-285702

(51) Int. Cl.
| | |
|---|---|
| H01L 21/20 | (2006.01) |
| H01L 21/205 | (2006.01) |
| C23C 16/24 | (2006.01) |
| H01L 21/02 | (2006.01) |
| C23C 16/02 | (2006.01) |

(52) U.S. Cl.
CPC ...... *H01L 21/02532* (2013.01); *C23C 16/0218* (2013.01); *C23C 16/24* (2013.01); *H01L 21/0245* (2013.01); *H01L 21/0262* (2013.01); *H01L 21/02381* (2013.01); *H01L 21/02488* (2013.01)

(58) Field of Classification Search
CPC ..................... H01L 21/0262; H01L 21/02381; H01L 21/02488; H01L 21/02532; H01L 21/0245; C23C 16/24; C23C 16/0218
See application file for complete search history.

(56) References Cited

U.S. PATENT DOCUMENTS

| | | | | |
|---|---|---|---|---|
| 4,388,342 | A * | 6/1983 | Suzuki et al. ...................... 427/8 |
| 7,531,679 | B2 * | 5/2009 | Wang ...................... C07F 7/025 |
| | | | | 427/255.27 |
| 7,863,203 | B2 * | 1/2011 | Wang ........................ C07F 7/10 |
| | | | | 257/E21.478 |
| 8,431,494 | B2 * | 4/2013 | Murakami et al. ............. 438/770 |
| 8,455,369 | B2 * | 6/2013 | Watanabe et al. .............. 438/763 |
| 8,722,510 | B2 * | 5/2014 | Watanabe et al. .............. 438/431 |
| 8,753,984 | B2 * | 6/2014 | Murakami et al. ............. 438/765 |
| 8,771,807 | B2 * | 7/2014 | Xiao ........................ C07F 7/025 |
| | | | | 427/578 |
| 8,802,882 | B2 * | 8/2014 | Wang ................. H01L 21/02271 |
| | | | | 556/410 |
| 8,895,414 | B1 * | 11/2014 | Kakimoto et al. ............. 438/482 |
| 8,912,353 | B2 * | 12/2014 | Xiao ........................ C07F 7/025 |
| | | | | 556/410 |
| 2004/0203255 | A1 * | 10/2004 | Itsuki ............................. 438/778 |
| 2009/0029532 | A1 * | 1/2009 | Huang et al. ................... 438/479 |

(Continued)

FOREIGN PATENT DOCUMENTS

| | | | | |
|---|---|---|---|---|
| EP | 2 669 248 A1 * | 12/2013 | .............. C01B 33/04 |
| EP | 2 818 474 A1 * | 12/2014 | .............. C01B 33/04 |

(Continued)

*Primary Examiner* — Mary Wilczewski
(74) *Attorney, Agent, or Firm* — Nath, Goldberg & Meyer; Jerald L. Meyer

(57) ABSTRACT

Provided is a method of forming a film including a silicon film on a base, including: forming a seed layer on a surface of the base by heating the base and supplying an aminosilane-based gas onto the surface of the heated base; and forming the silicon film on the seed layer by heating the base and supplying a silane-based gas containing no amino group onto the seed layer of the surface of the heated base, wherein a molecule of the aminosilane-based gas used in forming a seed layer comprises two or more silicon atoms.

9 Claims, 9 Drawing Sheets

(56) References Cited

U.S. PATENT DOCUMENTS

| | | | |
|---|---|---|---|
| 2010/0189927 A1* | 7/2010 | Sato et al. | 427/579 |
| 2010/0199853 A1* | 8/2010 | Blanc et al. | 99/323.3 |
| 2010/0311251 A1* | 12/2010 | Okada et al. | 438/761 |
| 2011/0263105 A1* | 10/2011 | Hasebe et al. | 438/482 |
| 2011/0287629 A1* | 11/2011 | Kakimoto et al. | 438/652 |
| 2011/0312192 A1* | 12/2011 | Murakami et al. | 438/787 |
| 2012/0028437 A1* | 2/2012 | Watanabe et al. | 438/425 |
| 2012/0164327 A1* | 6/2012 | Sato et al. | 427/248.1 |
| 2012/0164842 A1* | 6/2012 | Watanabe et al. | 438/763 |
| 2012/0164844 A1* | 6/2012 | Kakimoto et al. | 438/770 |
| 2012/0178264 A1* | 7/2012 | Murakami et al. | 438/765 |
| 2012/0277457 A1* | 11/2012 | Lehmann et al. | 556/410 |
| 2013/0005142 A1* | 1/2013 | Kakimoto et al. | 438/658 |
| 2013/0023110 A1* | 1/2013 | Kakimoto et al. | 438/482 |
| 2013/0052795 A1* | 2/2013 | Watanabe | 438/427 |
| 2013/0109155 A1* | 5/2013 | Okada et al. | 438/478 |
| 2013/0319290 A1* | 12/2013 | Xiao et al. | 106/287.11 |
| 2013/0323435 A1* | 12/2013 | Xiao et al. | 427/579 |
| 2014/0080321 A1* | 3/2014 | Hirose et al. | 438/792 |
| 2014/0113436 A1* | 4/2014 | Kato et al. | 438/478 |
| 2014/0179085 A1* | 6/2014 | Hirose et al. | 438/478 |
| 2014/0187024 A1* | 7/2014 | Obu et al. | 438/479 |
| 2014/0187025 A1* | 7/2014 | Obu et al. | 438/482 |
| 2014/0199853 A1* | 7/2014 | Murakami | H01L 21/67757 438/770 |
| 2015/0024608 A1* | 1/2015 | Mayorga | C09D 1/00 438/790 |
| 2015/0037970 A1* | 2/2015 | Hasebe | H01L 21/28525 438/607 |
| 2015/0037975 A1* | 2/2015 | Komori et al. | 438/657 |
| 2015/0087161 A1* | 3/2015 | Sato et al. | 438/787 |
| 2015/0101532 A1* | 4/2015 | Okada et al. | 118/704 |
| 2015/0147871 A1* | 5/2015 | Xiao | H01L 21/02126 438/482 |
| 2015/0279683 A1* | 10/2015 | Harada | H01L 21/28556 438/680 |

FOREIGN PATENT DOCUMENTS

| | | |
|---|---|---|
| JP | 63029954 | 2/1988 |
| JP | 01217956 | 8/1989 |
| JP | 2011-249764 | 12/2011 |
| JP | 2012-109537 A | 6/2012 |
| JP | 2013-26513 A | 2/2013 |
| JP | 2013-82986 A | 5/2013 |
| JP | 2013-95945 A | 5/2013 |

* cited by examiner

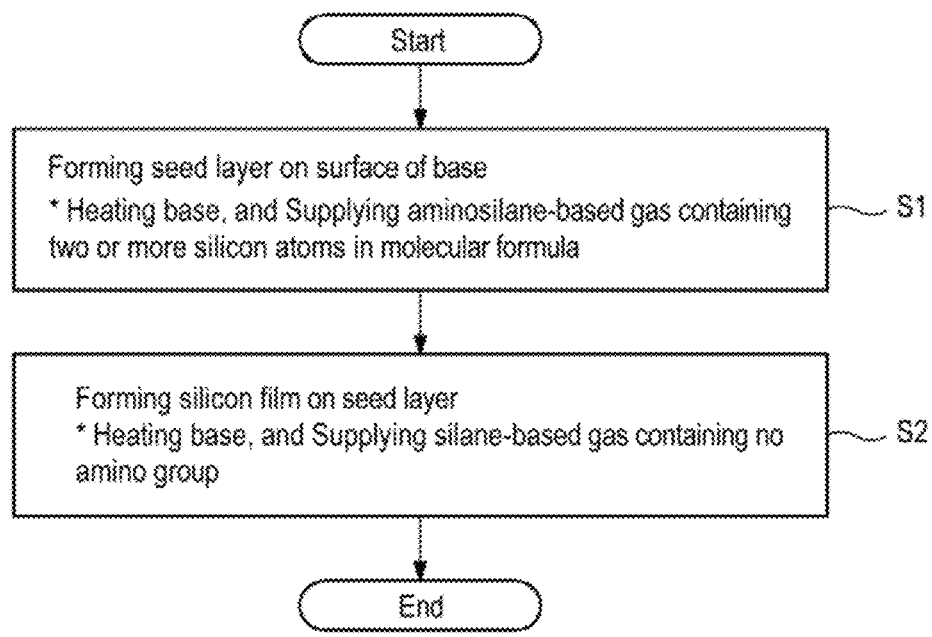

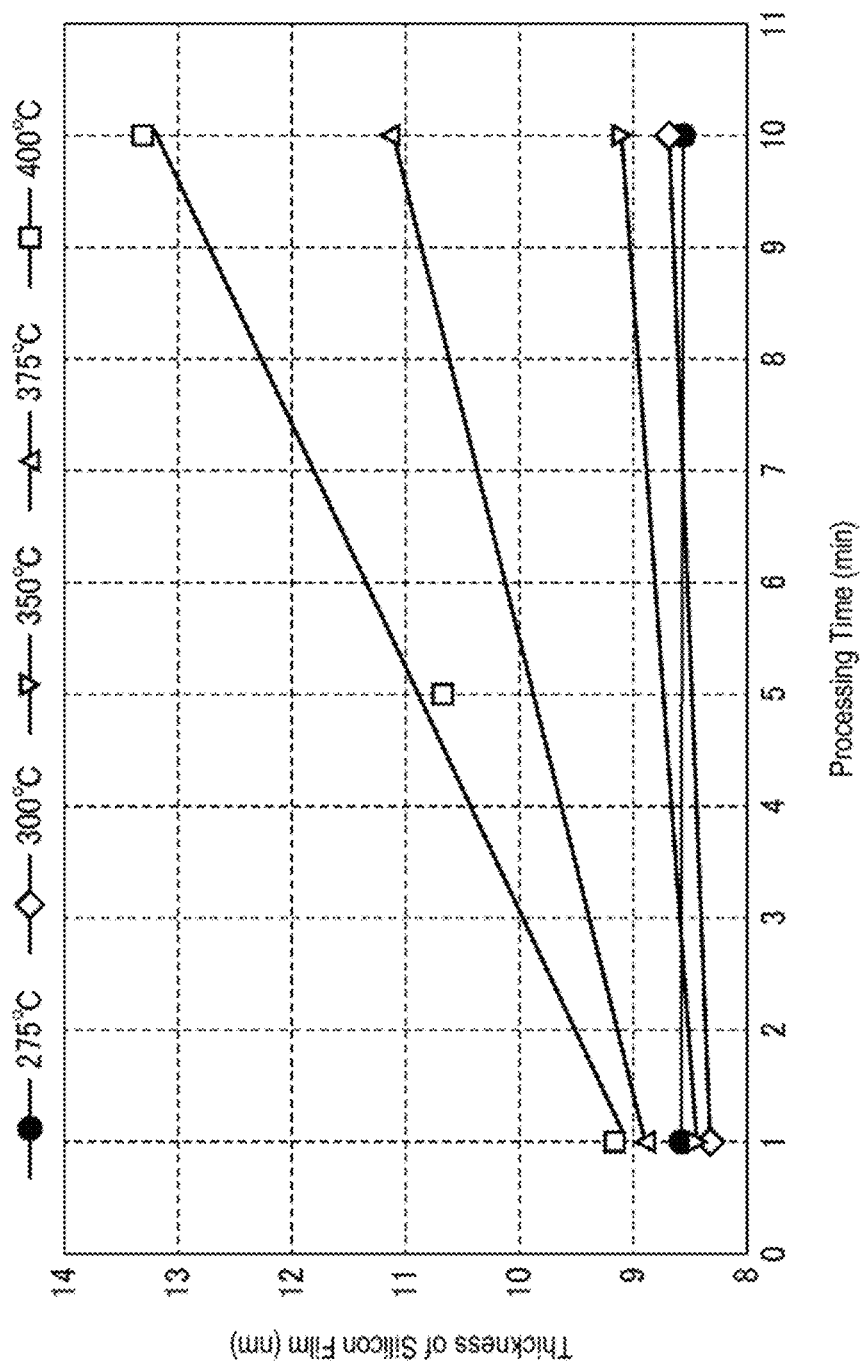

Increase in Film thickness due to Growth of Seed Layer

Increase in Film thickness due to Reduction of Incubation Time

FIG. 7

| Target thickness | 4nm | 3nm | 2nm | 1nm |
|---|---|---|---|---|
| DIPAS | Pinhole Absence<br>Depo Time: 24.2min<br>Thickness: 4.45nm | Pinhole Absence<br>Depo Time: 20.9min<br>Thickness: 3.09nm | Pinhole Presence<br>Depo Time: 14.4min<br>Thickness: 2.40nm | Pinhole Presence<br>Depo Time: 12.0min<br>Thickness: 1.68nm |
| DIPADS | Pinhole Absence<br>Depo Time: 22.6min<br>Thickness: 4.54nm | Pinhole Absence<br>Depo Time: 19.7min<br>Thickness: 3.19nm | Pinhole Absence<br>Depo Time: 16.6min<br>Thickness: 2.81nm | Pinhole Presence<br>Depo Time: 12.0min<br>Thickness: 1.84nm |

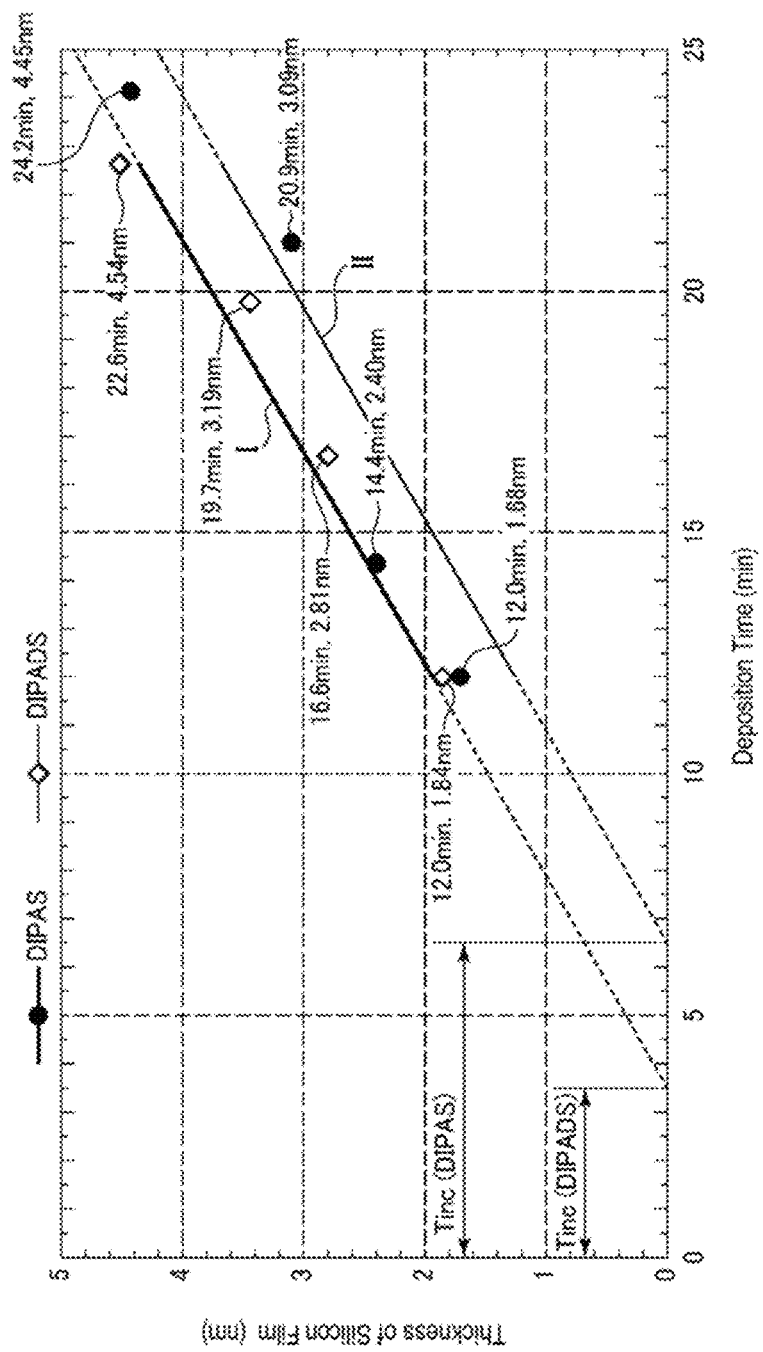

METHOD OF FORMING SILICON FILM

CROSS-REFERENCE TO RELATED APPLICATION

This application claims the benefit of Japanese Patent Application No. 2012-285702, filed on Dec. 27, 2012, in the Japan Patent Office, the disclosure of which is incorporated herein in its entirety by reference.

TECHNICAL FIELD

The present disclosure relates to a method of forming a silicon film and a film forming apparatus.

BACKGROUND

As a thin film for filling a contact hole or line or for forming a device or structure in a semiconductor integrated circuit device, silicon, for example, amorphous silicon has been used. In a conventional method, an amorphous silicon film is formed by thermally decomposing monosilane at a temperature of 400 to 600 degrees C. Alternatively, an amorphous silicon film is formed by decomposing disilane at a temperature of 400 to 500 degrees C., decomposing trisilane at a temperature of 350 to 450 degrees C., or decomposing tetrasilane at a temperature of 300 to 400 degrees C.

However, if a contact hole or line being more miniaturized is filled with amorphous silicon, the film formed of amorphous silicon has poor coverage in the contact hole portion, which results in large voids. If the large voids are generated in the contact hole or line, they are one of the factors causing, for example, an increase in resistance. They also deteriorate the accuracy of surface roughness of the amorphous silicon film.

Therefore, in order to improve the accuracy of surface roughness of an amorphous silicon film, a method of forming an amorphous silicon film, in which before an amorphous silicon film is formed, an aminosilane-based gas is supplied on a base surface and a seed layer is previously formed on the base surface, has been proposed.

However, in addition to a need for improvement of surface roughness accuracy of a silicon film, for example, an amorphous silicon film, there is also an increasing requirement for further film thinning, which poses more significant problems.

According to the above conventional art, it may be possible to achieve the object of improving the surface roughness accuracy. However, since further film thinning is required, pinholes are easily formed approximately in 2 nm order and thus it is difficult to thin a film in not more than 2 nm order.

SUMMARY

Some embodiments of the present disclosure provide a method of forming a silicon film and a film forming apparatus, which make it possible to cope with a request for even further thinning a film and also to improve surface roughness accuracy.

According to one embodiment of the present disclosure, provided is a method of forming a film including a silicon film on a base, including: forming a seed layer on a surface of the base by heating the base and supplying an aminosilane-based gas onto the heated base surface; and forming the silicon film on the seed layer by heating the base and supplying a silane-based gas containing no amino group onto the seed layer of the surface of the heated base, wherein a molecule of the aminosilane-based gas used in forming a seed layer comprises two or more silicon atoms.

According to another embodiment of the present disclosure, provided is a film forming apparatus configured to form a silicon film on a base, the apparatus including: a processing chamber configured to accommodate an object to be processed having the base to be formed thereon with the silicon film; a processing gas supply unit configured to supply the processing chamber with gases used in processing; a heating unit configured to heat the object to be processed accommodated in the processing chamber; an exhaust unit configured to exhaust gas from the processing chamber; and a controller configured to control the processing gas supply unit, the heating unit and the exhaust unit to perform the aforementioned method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating an example sequence of a method of forming a silicon film according to a first embodiment of the present disclosure;

FIG. 3 is a graph illustrating a relationship between a processing time and a film thickness of a silicon film;

FIG. 7 shows photographs showing secondary electron images of surfaces of silicon films;

FIG. 8 is a graph illustrating a relationship between a deposition time and a film thickness of a silicon film.

DETAILED DESCRIPTION

Figure 2A:
FIGS. 2A to 2C are cross-sectional views schematically showing states of a semiconductor substrate being formed during the sequence.

Hereinafter, embodiments of the present disclosure will be described with reference to the drawings. In addition, throughout the drawings, like reference numerals are used to designate like elements. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(First Embodiment)
<Definition>

The term "amorphous silicon" described herein does not refer to only amorphous silicon but also any material including nanocrystalline silicon having amorphous or nano-sized crystal grains, and silicon with a mixture of amorphous silicon and nanocrystalline silicon, which can achieve the surface roughness accuracy to the extent as disclosed herein.

In addition, as used herein, 1 Torr is defined as 133 Pa.

<Film Forming Method>

Figure 2B:
Figure 2C:
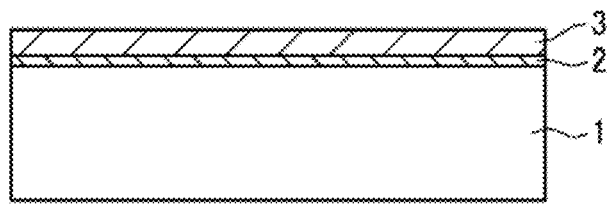

FIG. 1 is a flowchart illustrating an example sequence of a method of forming a silicon film according to a first embodiment of the present disclosure, and FIGS. 2A to 2C are cross-sectional views schematically showing states of a semiconductor substrate being formed during the sequence.

First, a semiconductor substrate shown in FIG. 2A, for example, a silicon substrate 1 is loaded into a processing chamber of a film forming apparatus. In the example, a base on which a silicon film is formed is the silicon substrate 1, or a native oxide film (not shown) which has been grown on a surface of the silicon substrate 1. In an alternative embodiment, the base may be a material containing silicon, for example, a silicon film (including a silicon substrate), a silicon oxide film (including a native oxide film, a thermal oxide film and a CVD film), or a silicon nitride film. In another embodiment, the base may be a metal film other than the material containing silicon.

Next, as shown in FIGS. 1 and 2B, a seed layer 2 is formed on a surface of the silicon substrate (base) 1. In this embodiment, the silicon substrate (base) 1 is heated, and an aminosilane-based gas containing two or more silicon atoms in the molecular formula is allowed to flow onto the surface of the heated silicon substrate 1. Accordingly, the seed layer 2 is formed on the surface of the silicon substrate (base) 1 (Step S1).

An example of the aminosilane-based gas containing two or more silicon atoms in the molecular formula includes amino silicon compounds represented by the following formulas:

or

wherein in Formulas (A) and (B), n is the number of amino groups, which is a natural number of 1 to 6, m is the number of alkyl groups, which is 0 or a natural number of 1 to 5, R1=CH$_3$, R2=C$_2$H$_5$ and R3=C$_3$H$_7$, R1=R2=R3, or they may not be the same, R3 may be Cl, and X is a natural number of not less than 2.

In addition, a gas containing at least one of the amino silicon compounds represented by Formulas (A) and (B) may be selected as the processing gas in Step S1.

An example of the amino silicon compound represented by Formula (A) includes:
 diisopropylaminodisilane (Si$_2$H$_5$N(iPr)$_2$),
 diisopropylaminotrisilane (Si$_3$H$_7$N(iPr)$_2$),
 diisopropylaminodichlorosilane (Si$_2$H$_4$ClN(iPr)$_2$),
 diisopropylaminotrichlorosilane (Si$_3$H$_6$ClN(iPr)$^2$), and the like.

In addition, an example of the amino silicon compound represented by Formula (B) includes:
 diisopropylaminocyclodisilane (Si$_2$H$_3$N(iPr)$_2$),
 diisopropylaminocyclotrisilane (Si$_3$H$_5$N(iPr)$_2$),
 diisopropylaminodichlorocyclodisilane (Si$_2$H$_2$ClN(iPr)$_2$),
 diisopropylaminodichlorocyclotrisilane (Si$_3$H$_4$ClN (iPr)$_2$), and the like.

In the above example, diisopropylaminodisilane (DIPADS) represented by Formula (A) was used.

An example of processing conditions in Step S1 is as follows:
 DIPADS Flow Rate: 200 sccm
 Processing Time: 1 min
 Processing Temperature: 350 degrees C.
 Processing Pressure: 133 Pa (1 Torr).

Next, as shown in FIGS. 1 and 2C, a silicon film 3 is formed on the seed layer 2. In the above example, the silicon substrate (base) 1 is heated, and a silane-based gas containing no amino group is supplied onto a surface of the seed layer 2 formed on the surface of the heated silicon substrate 1. Accordingly, the silicon film 3 is formed on the seed layer 2 (Step S2). Also, in the example, the silicon film 3 is an amorphous silicon film.

An example of the silane-based gas containing no amino group includes silicon hydrides represented by the following formulas:

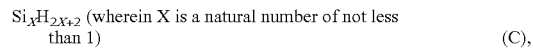

or

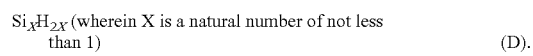

In addition, a gas containing at least one of the silicon hydrides represented by Formulas (C) and (D) may be selected as the processing gas (silicon source gas) in Step S2.

An example of the silicon hydride represented by Formula (C) includes:
 monosilane (SiH$_4$),
 disilane (Si$_2$H$_6$),
 trisilane (Si$_3$H$_8$),
 tetrasilane (Si$_4$H$_{10}$),
 pentasilane (Si$_5$H$_{12}$),
 hexasilane (Si$_6$H$_{14}$), and
 heptasilane (Si$_7$H$_{16}$).

In addition, an example of the silicon hydride represented by Formula (D) includes:
 cyclosilane (SiH$_2$),
 cyclodisilane (Si$_2$H$_4$),
 cyclotrisilane (Si$_3$H$_6$),
 cyclotetrasilane (Si$_4$H$_8$),
 cyclopentasilane (Si$_5$H$_{10}$),
 cyclohexasilane (Si$_6$H$_{12}$), and
 cycloheptasilane (Si$_7$H$_{14}$).

Here, in case of using a combination of the aminosilane-based gas containing two or more silicon atoms in the molecular formula and the silane-based gas containing no amino group, monosilane (SiH$_4$) or disilane (Si$_2$H$_6$) may be used, because this is easily thermally decomposed approximately at a temperature at which the aminosilane-based gas containing two or more silicon atoms in the molecular formula is thermally decomposed.

In the above example, Si$_2$H$_6$ represented by Formula (C) was used.

An example of processing conditions in Step S2 is as follows:
 Si$_2$H$_6$ Flow Rate: 300 sccm
 Deposition Time: 40 min
 Deposition Temperature: 400 degrees C.
 Deposition Pressure: 133 Pa (1 Torr).

As described above, according to the method of forming a silicon film of the first embodiment, after the seed layer 2 is formed by supplying the aminosilane-based gas containing two or more silicon atoms in the molecular formula onto the surface of the heated silicon substrate (base) 1, the silicon film 3, for example, the amorphous silicon film 3, is formed on the seed layer 2 by supplying the silane-based gas containing no amino group on the seed layer 2 formed on the surface of the heated silicon substrate 1 and, for example, thermally decomposing the silane-based gas containing no amino group.

First, advantages of the silicon film 3 according to the first embodiment are as follows. That is, the seed layer 2 is formed of the aminosilane-based gas containing two or more silicon atoms in the molecular formula, and the silicon film 3 is formed on the seed layer 2 by thermally decomposing the silane-based gas containing no amino group. Accordingly, as compared with a silicon film formed only by thermally decomposing the silane-based gas containing no amino group without forming the seed layer 2, an incubation time of the silicon film 3 is reduced, and thus, the surface roughness of the amorphous silicon film 3 can be improved. The surface roughness of the amorphous silicon film is related to the incubation time of the amorphous silicon film. This is because, since the increased incubation time makes it easier for nucleus size to vary, the incubation time affects the surface roughness accuracy of the amorphous silicon film, which begins to be deposited after nuclei are generated. Accordingly, as the incubation time of the amorphous silicon film is reduced, the surface roughness accuracy of the amorphous silicon film is improved.

<Relationship between Processing Temperature and Incubation Time in Formation of Seed Layer>

In addition, the first embodiment aims to even further thin the silicon film 3. Accordingly, the processing temperature in the formation of the seed layer 2 was further considered. That is, a relationship between an effect of reducing the incubation time obtained by forming the seed layer 2 and the processing temperature was analyzed.

It is because in order to aim to even further thin the silicon film 3, the thickness of the seed layer 2 formed under the silicon film 3 needs to be proximate to a monoatomic layer level to the extent as possible. It is speculated that the thickness of the seed layer 2 will be proximate to a monoatomic layer if the processing temperature is in a temperature range, in which incubation time is effectively reduced due to the formation of the seed layer 2, and is equal to or less than a boundary temperature, at which the seed layer 2 begins CVD growth.

FIG. 3 is a graph illustrating a relationship between a processing time and a film thickness of the silicon film.

The results shown in FIG. 3 were obtained under the processing conditions in Steps S1 and S2 as follows:

(Step S1)
DIPADS Flow Rate: 200 sccm
Processing Time: Two Measurements for 1 min and 10 min
Processing Temperature: 400 degrees C., 375 degrees C., 350 degrees C., 300 degrees C., 275 degrees C.
Processing Pressure: 133 Pa (1 Torr)
(Step S2)
$Si_2H_6$ Flow Rate: 300 sccm
Deposition Time: 40 min
Deposition Temperature: 400 degrees C.
Deposition Pressure: 133 Pa (1 Torr).

<(1) Step S1 (marked as "□" in FIG. 3): Processing Temperature of 400 degrees C., Processing Time of 1 min to 10 min>

A thickness increase of about 4 nm in the silicon film 3 was observed during the processing time in a range of 1 min to 10 min.

<(2) Step S1 (marked as "Δ" in FIG. 3): Processing Temperature of 375 degrees C., Processing Time of 1 min to 10 min>

A thickness increase of about 2.2 nm in the silicon film 3 was observed during the processing time in a range of 1 min to 10 min.

<(3) Step S1 (marked as "∇" in FIG. 3): Processing Temperature of 350 degrees C., Processing Time of 1 min to 10 min>

A thickness increase of about 0.7 nm in the silicon film 3 was observed during the processing time in a range of 1 min to 10 min.

<(4) Step S1 (marked as "◊" in FIG. 3): Processing Temperature of 300 degrees C., Processing Time of 1 min to 10 min>

A thickness increase of about 0.5 nm in the silicon film 3 was observed during the processing time in a range of 1 min to 10 min.

<(5) Step S1 (marked as "●" in FIG. 3): Processing Temperature of 275 degrees C., Processing Time of 1 min to 10 min>

A thickness increase in the silicon film 3 was not observed during the processing time in a range of 1min to 10 min.

Figure 4:
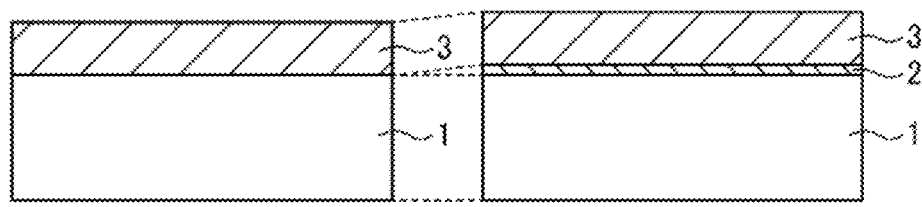
FIG. 4 is cross-sectional views showing an increase in film thickness due to seed layer growth.

As described above, when DIPADS was used as the processing gas, since a thickness increase in the silicon film 3 was not observed at a processing temperature of 275 degrees C., it is assumed that the seed layer 2 was not formed on the surface of the silicon substrate 1. In addition, since a thickness increase in the silicon film 3 was observed at a processing temperature of 300 degrees C., it is assumed that the seed layer 2 begins to be formed approximately at a processing temperature of 300 degrees C. This is attributed to the fact that, as shown in FIG. 4, the silicon film 3 is observed as being increased in thickness as much as the seed layer 2 is newly formed, provided that the film thickness of the silicon film 3 does not change depending on the existence of the seed layer 2.

Figure 5:
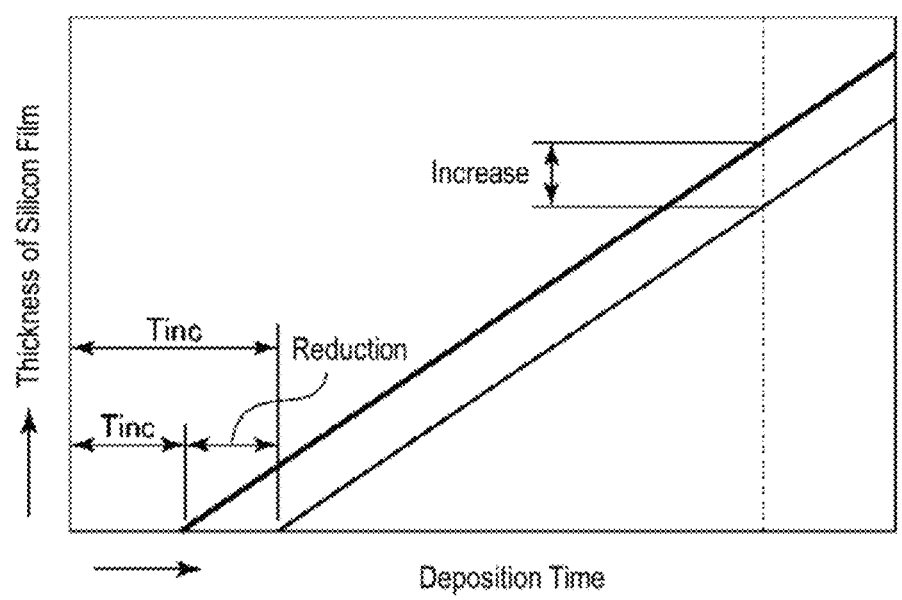
FIG. 5 is a graph illustrating a relationship between a deposition time and a film thickness of a silicon film.
Figure 6:
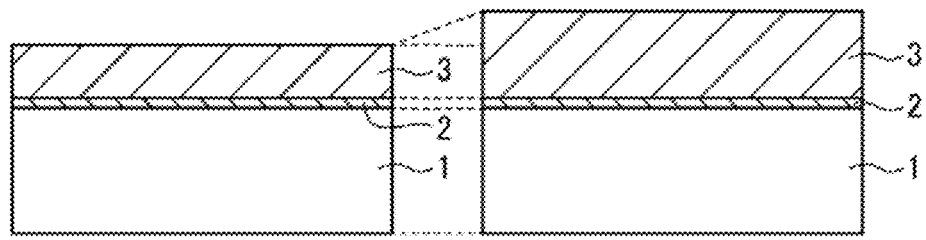
FIG. 6 is cross-sectional views showing a shape of film thickness according to a reduction in incubation time.

Also, in comparison between processing temperatures of 300 degrees C. and 350 degrees C., the thickness of the silicon film 3 was further increased at 350 degrees C. than at 300 degrees C. Based on this observation, it is assumed that the incubation time of the silicon film 3 is further reduced at a processing temperature of 350 degrees C. than at a processing temperature of 300 degrees C. More particularly, as shown in FIG. 5, if the incubation time Tinc is further reduced, the silicon film 3 begins to be deposited earlier. Thus, if the deposition is performed for the same time, as the incubation time Tinc becomes shorter, the deposition is performed for a longer time. Therefore, as shown in FIG. 6, the thickness of the silicon film 3 was increased as much as the amount of time for which deposition was performed on the silicon film 3. Accordingly, it is assumed that the incubation time of the silicon film 3 at a processing temperature of 350 degrees C. is shorter than the incubation time of the silicon film 3 at a processing temperature of 300 degrees C. The same applies to processing temperatures of 375 degrees C. and 400 degrees C.

From these results, when aiming to even further thin the silicon film 3, the processing temperature in Step S1 may be set to be 300 to 350 degrees C. Although it is possible to thin the silicon film by shortening the deposition time of the silicon film 3, i.e., the deposition time in Step S2 even at a processing temperature of 375 to 400 degrees C., as is also apparent from the results shown in FIG. 3, a film thickness difference of 0.5 to 1 nm is observed between a processing temperature of 300 to 350 degrees C. and a processing temperature of 375 to 400 degrees C. even when the processing time in Step S1 is 1 min. In light of this, when aiming to even further thin the silicon film 3, the processing temperature in Step S1 may be set to be not less than 300 degrees C. to not more than 350 degrees C.

<Observation of Surface of Silicon Film 3>

Next, using a scanning electron microscope (SEM), a result of observing the surface of the silicon film 3 will be described.

FIG. 7 is photographs showing secondary electron images of surfaces of silicon films.

FIG. 7 shows results of observing the cases where two types of gases as indicated below were used as the processing gas used in Step S1 for forming the seed layer 2:

(1) aminosilane-based gas containing only one silicon atom in the molecular formula, and (2) aminosilane-based gas containing two or more silicon atoms in the molecular formula.

As an aminosilane-based gas containing only one silicon atom in the molecular formula, diisopropylaminosilane (DIPAS: $SiH_3N(iPr)_2$) was used, while as an aminosilane-based gas containing two or more silicon atoms in the molecular formula, diisopropylaminodisilane (DIPADS: $Si_2H_5N(iPr)_2$) was used.

The results shown in FIG. 7 were obtained under the processing conditions in Steps S1 and S2 as follows.

<(1) Aminosilane-Based Gas Including only One Silicon Atom in Molecular Formula>

In this case, the processing conditions are as follows:
(Step S1)
DIPAS Flow Rate: 200 sccm
Processing Time: 1 min
Processing Temperature: 400 degrees C.
Processing Pressure: 133 Pa (1 Torr).
(Step S2)
$Si_2H_6$ Flow Rate: 300 sccm
Deposition Time: 12.0, 14.4, 20.9, 24 2 min
Deposition Temperature: 400 degrees C.
Deposition Pressure: 133 Pa (1 Torr).

<(2) Aminosilane-Based Gas Including Two or More Silicon Atoms in Molecular Formula>

In this case, the processing conditions are as follows:
(Step S1)
DIPADS Flow Rate: 200 sccm
Processing Time: 1 min
Processing Temperature: 350 degrees C.
Processing Pressure: 133 Pa (1 Torr).
(Step S2)
$Si_2H_6$ Flow Rate: 300 sccm
Deposition Time: 12.0, 16.6, 19.7, 22 6 min
Deposition Temperature: 400 degrees C.
Deposition Pressure: 133 Pa (1 Torr).

As shown in FIG. 7, in a case where the processing gas in Step S1 is (1) DIPAS, if the deposition time in Step S2 is set to be short and the film thickness of the silicon film 3 to be formed is reduced, pinholes begin to occur at the film thickness of the silicon film 3 of 2 nm order.

In comparison to the above results, when the processing gas in Step S1 is set to be (2) DIPADS as in the first embodiment, the process for forming the silicon film 3 was improved to the extent that no pinhole is observed even at the film thickness of the silicon film 3 of 2 nm order and pinholes barely occur when the film thickness reaches 1 nm order.

<Incubation Time of Silicon Film 3>

In addition, from the results shown in FIG. 7, according to the first embodiment, it is confirmed that an effect of even further reducing the incubation time of the silicon film 3 was obtained.

FIG. 8 is a graph illustrating a relationship between a deposition time and a film thickness of the silicon film.

The results shown in FIG. 7 are plotted in FIG. 8 as a graph illustrating a deposition time on the axis of abscissa and a film thickness of the silicon film 3 on the axis of ordinate. As shown in FIG. 8, the incubation time Tinc of DIPADS marked by "◇" (line I) tends to be more reduced than the incubation time Tinc of DIPAS marked by "●" (line II)

That is, by using the aminosilane-based gas containing two or more silicon atoms in the molecular formula, for example, DIPADS, as the processing gas in Step S1, it is possible to further reduce the incubation time of the silicon film 3 that is formed thereon.

According to the first embodiment capable of further reducing the incubation time of the silicon film 3, it is possible to obtain an advantage in that the surface roughness accuracy of the amorphous silicon film can be further improved as compared with the case of using the aminosilane-based gas containing only one silicon atom.

According to the method of forming a silicon film of the first embodiment, it is possible to cope with a request for even further thinning a film and also to improve surface roughness accuracy.

(Second Embodiment)

The following is a description of an example of a film forming apparatus, in which the method of forming a silicon film according to the first embodiment of the present disclosure can be performed, as a second embodiment of the present disclosure.

<Film Forming Apparatus>

Figure 9:
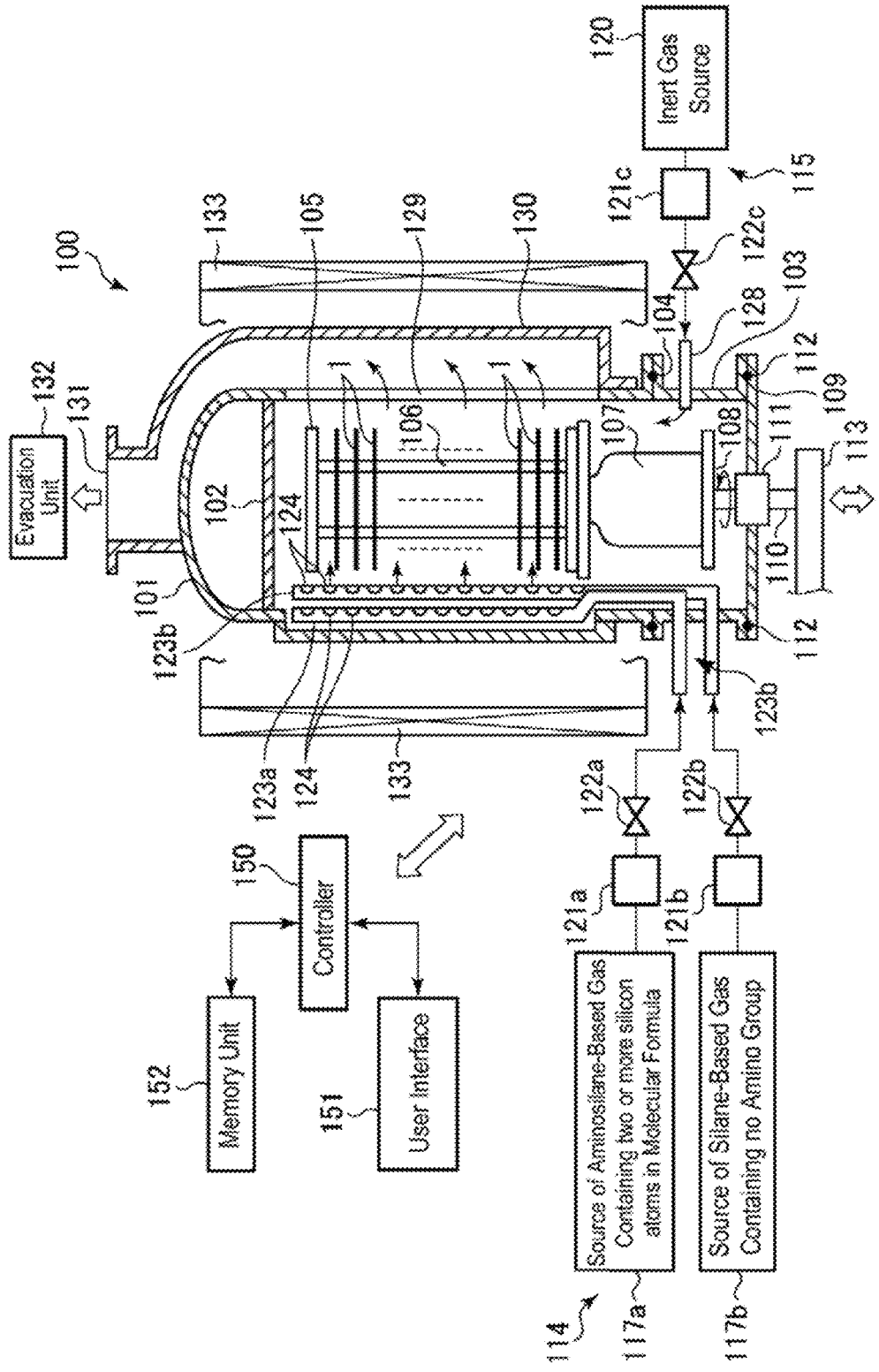
FIG. 9 is a cross-sectional view schematically showing an example film forming apparatus in which the method of forming a silicon film according to the first embodiment of the present disclosure can be performed.

FIG. 9 is a cross-sectional view schematically showing the film forming apparatus according to the second embodiment of the present disclosure.

As shown in FIG. 9, a film forming apparatus 100 includes a cylindrical processing chamber 101 having an open lower end and a ceiling. The processing chamber 101 is entirely formed, for example, of quartz. A quartz ceiling plate 102 is installed at the ceiling in the processing chamber 101. A manifold 103, which, for example, is formed of stainless steel in the shape of a cylinder, is coupled to the opening of the lower end of the processing chamber 101 through a sealing member 104 such as an O-ring.

The manifold 103 supports the lower end of the processing chamber 101. A wafer boat 105 made of quartz is configured to be insertable into the processing chamber 101 from below the manifold 103, wherein in the wafer boat 105, a plurality of sheets, for example, 50 to 100 sheets of semiconductor substrates (the silicon substrates 1 in this example,) are loaded and stacked in multiple stages as objects to be processed. Accordingly, the silicon substrates 1 are accommodated in the processing chamber 101. The wafer boat 105 has a plurality of support rods 106, and the plurality of silicon substrates 1 are supported by grooves formed in the support rods 106.

The wafer boat 105 is loaded on a table 108 through a thermal insulation container 107 made of quartz. The table 108 is supported on a rotating shaft 110, which penetrates a lid portion 109 for opening and closing a lower end of the manifold 103, wherein the lid portion 109 is made, for example, of stainless steel. The portion penetrated by the rotating shaft 110, for example, is fitted with a magnetic fluid seal 111 and airtightly seals and supports the rotating shaft 110 to be rotatable. A sealing member 112 such as an O-ring is interposed and installed between a periphery of the lid portion 109 and the lower end of the manifold 103. Accordingly, the processing chamber 101 is maintained to be sealed. The rotating shaft 110 is mounted on a leading end of an arm 113 supported by a lift unit (not shown) such as a boat elevator. Accordingly, the wafer boat 105, the lid portion 109, and the like are lifted up or down together to be inserted into or be separated from the processing chamber 101.

The film forming apparatus 100 includes a processing gas supply unit 114 for supplying the processing chamber 101 with gases used for processing, and an inert gas supply unit 115 for supplying the processing chamber 101 with an inert gas.

The processing gas supply unit 114 of the example includes a source 117a of the aminosilane-based gas containing two or more silicon atoms in the molecular formula (which may be hereinafter referred to as "aminosilane-based gas source 117a") and a source 117b of the silane-based gas containing no amino group (which may be hereinafter referred to as "silane-based gas source 117b"). In addition, the inert gas supply unit 115 includes an inert gas supply source 120. An example of the aminosilane-based gas containing two or more silicon atoms in the molecular formula is DIPADS, and an example of the silane-based gas containing no amino group is $Si_2H_6$. An example of the inert gas is nitrogen gas. The inert gas is used as a purge gas or the like.

The aminosilane-based gas source 117a is coupled to a dispersion nozzle 123a via a flow rate controller 121a and an opening/closing valve 122a. Similarly, the silane-based gas source 117b is coupled to a dispersion nozzle 123b via a flow rate controller 121b and an opening/closing valve 122b.

The dispersion nozzles 123a and 123b, which are made of quartz pipes, penetrate a sidewall of the manifold 103 inwards, bend upwards and extend vertically. Each vertical portion of the dispersion nozzles 123a and 123b includes a plurality of gas ejection holes 124 formed to be spaced apart from each other at predetermined intervals. Accordingly, each gas is ejected approximately uniformly from the gas ejection holes 124 toward the interior of the processing chamber 101 in the horizontal direction.

The inert gas supply source 120 is coupled to a nozzle 128 via a flow rate controller 121c and an opening/closing valve 122c. The nozzle 128 penetrates the sidewall of the manifold 103, and ejects the inert gas from its leading end toward the interior of the processing chamber 101 in the horizontal direction.

An exhaust opening 129 for evacuating the processing chamber 101 is installed at a portion opposite to the dispersion nozzles 123a and 123b in the processing chamber 101. The exhaust opening 129 is formed into an elongated shape by cutting off a portion of the sidewall of the processing chamber 101 in the vertical direction. An exhaust opening cover member 130, which is formed to have a 90 degree-rotated U-shaped cross-section so as to cover the exhaust opening 129, is mounted on a portion corresponding to the exhaust opening 129 of the processing chamber 101 by welding. The exhaust opening cover member 130 extends upward along the sidewall of the processing chamber 101 and defines a gas outlet 131 at an upper portion of the processing chamber 101. An exhaust unit 132, including a vacuum pump or the like, is coupled to the gas outlet 131. The exhaust unit 132 evacuates the processing chamber 101 to exhaust the processing gas used in the processing and to make the pressure in the processing chamber 101 be a processing pressure required as the processing progresses.

A cylindrical heating unit 133 is installed on an outer periphery of the processing chamber 101. The heating unit 133 activates the gas supplied into the processing chamber 101 and simultaneously heats objects to be processed that are accommodated in the processing chamber 101, i.e., the silicon substrates 1 in this example.

The control of each component of the film forming apparatus 100 is performed, for example, by a controller 150 including a microprocessor (computer). A user interface 151, which includes a touch panel for input operation of commands and the like for an operator to control the film forming apparatus 100, a display for visualizing and displaying the operational status of the film forming apparatus 100, and the like, is coupled to the controller 150.

A memory unit 152 is coupled to the controller 150. The memory unit 152 stores a control program for implementing various types of processing performed in the film forming apparatus 100 by controlling the controller 150, or stores a program for performing the processing for the respective components of the film forming apparatus 100 according to processing conditions, e.g., a recipe. The recipe is stored, for example, in a storage medium of the memory unit 152. The storage medium may be a portable memory, such as a CD-ROM, DVD, or flash memory, as well as a hard disk or semiconductor memory. In addition, the recipe may be suitably transmitted from other units, for example, through a dedicated communication line. The recipe, as needed, is read from the memory unit 152 according to instructions or the like input from the user interface 151, and the processing according to the read recipe is performed by the controller 150, so that the film forming apparatus 100 performs requested processing under the control of the controller 150.

In the present example, under the control of the controller 150, film forming processing according to the method of forming a silicon film of the first embodiment is performed in sequence.

The method of forming a silicon film according to the first embodiment may be performed in one film forming apparatus by using the film forming apparatus 100 as shown in FIG. 9.

Also, the film forming apparatus is not limited to the batch type as shown in FIG. 9, and may be a single wafer type film forming apparatus.

Although the present disclosure has been described according to the above-described embodiments, the present disclosure is not limited to the above-described embodiments and may be diversely modified.

For example, although the processing conditions are specifically illustrated in the above embodiments, the processing conditions are not limited to the above specific examples. For example, the surface roughness of the silicon film 3 (for example, amorphous silicon film) is improved by providing a configuration where the seed layer 2 is formed on the surface of the base by allowing the aminosilane-based gas containing two or more silicon atoms in the molecular formula to flow onto the heated surface of the silicon substrate (base) 1, and then, the silicon film 3, for example, the amorphous silicon film 3 is formed on the seed layer 2 by supplying the silane-based gas containing no amino group onto the seed layer 2 and, for example, thermally decomposing the silane-based gas containing no amino group.

Therefore, the processing conditions may not be limited to the specific examples described in the embodiments. Alternatively, the processing conditions may be modified according to the size of the silicon substrate 1, a volume change of the processing chamber, or the like within the scope without losing the above-described advantages.

In addition, the film forming method described in the above embodiments may achieve even further thinning of the silicon film 3 and even more improvement of the surface roughness of the silicon film 3. Accordingly, the film forming method described in the embodiments may be suitably used in a method of manufacturing electronic devices that have been gradually miniaturized, for example, a process of manufacturing semiconductor devices or a process of manufacturing flat panel displays.

In addition, as the seed layer 2 becomes thicker, the film thickness of the silicon film 3 including the seed layer 2 increases as described above. Also, the seed layer 2 functions to make nuclei of silicon to be uniformly generated. Accordingly, the thickness of the seed layer 2 may be controlled to be small. In some embodiments, the seed layer 2 may have a thickness of a monoatomic layer level or so. More specifically, the seed layer 2 may have a thickness of not less than 0.1 nm to not more than 0.3 nm.

Further, in the above-described embodiments, when the processing temperature of Step S1 is set to be 300 degrees C. and the processing time is set to be 1 min and 10 min, it may be assumed that since the thickness of the silicon film 3 was increased by about 0.5 nm, the seed layer 2 having a maximum thickness of 0.5 nm was formed. However, if the processing time is shorter than 10 min, it is possible to make the thickness of the seed layer 2 not less than 0.1 nm and not more than 0.3 nm.

In addition, the aminosilane-based gas containing two or more silicon atoms in the molecular formula may be adsorbed without being decomposed, for example, on the silicon substrate (base) 1. For example, DIPADS is thermally decomposed at a temperature of not less than 350 degrees C. If aminosilane is thermally decomposed, in some cases, impurities such as carbon (C) or nitrogen (N) may be introduced into the film that is being formed. If the aminosilane is adsorbed without being decomposed, for example, on the silicon substrate (base) 1, it is possible that impurities can be advantageously prevented from being introduced into the film that is being formed.

In addition, to even further thin the silicon film 3 as described in the above embodiments, the combined film thickness of the seed layer 2 and the silicon film 3 may be set to be a finite value of not more than 2 nm.

However, as described above, according to the method of forming a silicon film of the first embodiment, there is an advantage in that the incubation time can be further improved and as a result, the surface roughness accuracy can be further improved. In light of the foregoing, the method may be suitably used even in a case where the silicon film 3 is formed thick. For example, the method may be used when the silicon film 3 is formed to have a thickness between not less than 50 nm and not more than 100 nm generally used in semiconductor devices and also to have a smaller film thickness, for example, a thickness in a range of more than 2 nm to less than 50 nm.

In addition, the present disclosure may be modified within the scope without departing the spirit thereof According to the present disclosure, there is provided a method of forming a silicon film and a film forming apparatus, which make it possible to cope with a request for even further thinning a film and also to improve surface roughness accuracy.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a film including a silicon film on a base, comprising:
    forming a seed layer on a surface of the base by heating the base and supplying an aminosilane-based gas onto the heated base surface; and
    forming the silicon film on the seed layer by heating the base and supplying a silane-based gas containing no amino group onto the seed layer of the surface of the heated base,
    wherein a molecule of the aminosilane-based gas used in forming a seed layer comprises two or more silicon atoms, and
    wherein the aminosilane-based gas containing two or more silicon atoms in the aminosilane-based gas molecule is selected from gases containing at least one of amino silicon compounds represented by the following formula:

$$((R1R2)N)_n Si_X H_{2X-n-m}(R3)_m: \quad (B)$$

wherein in Formula (B),
n is the number of amino groups, which is a natural number of 1 to 6,
m is the number of alkyl groups, which is 0 or a natural number of 1 to 5,
R1=CH$_3$, R2=C$_2$H$_5$ and R3=C$_3$H$_7$,
R1=R2=R3, or they may not be the same,
R3=Cl, and
X is a natural number of not less than 2.

2. The method of claim 1, wherein the aminosilane-based gas represented by Formula (B) includes:
    diisopropylaminocyclodisilane (Si$_2$H$_3$N(iPr)$_2$),
    diisopropylaminocyclotrisilane (Si$_3$H$_5$N(iPr)$_2$),
    diisopropylaminodichlorocyclodisilane (Si$_2$H$_2$ClN(iPr)$_2$), and
    diisopropylaminodichlorocyclotrisilane (Si$_3$H$_4$ClN(iPr)$_2$).

3. The method of claim 1, wherein a heating temperature of the base in forming a seed layer is lower than a heating temperature of the base in forming the silicon film, and a processing time for forming the seed layer in forming a seed layer is shorter than a processing time for forming the silicon film in forming the silicon film.

4. The method of claim 3, wherein a heating temperature of the base in forming a seed layer is not less than 300 degrees C. and not more than 350 degrees C.

5. The method of claim 4, wherein the seed layer includes a monoatomic adsorption layer.

6. The method of claim 1, wherein a combined film thickness of the seed layer and the silicon film is a finite value of not more than 2 nm order.

7. The method of claim 1, wherein the silane-based gas containing no amino group is selected from gases containing at least one of silicon hydrides represented by the following formulas:

$$Si_X H_{2X+2} \text{ (wherein X is a natural number of not less than 1)} \quad (C),$$

or $$Si_X H_{2X} \text{ (wherein X is a natural number of not less than 1)} \quad (D).$$

8. The method of claim 7, wherein the silicon hydride represented by Formula (C) is selected from at least one of:
    monosilane (SiH$_4$),
    disilane (Si$_2$H$_6$),
    trisilane (Si$_3$H$_8$),
    tetrasilane (Si$_4$H$_{10}$),
    pentasilane (Si$_5$H$_{12}$),
    hexasilane (Si$_6$H$_{14}$), and
    heptasilane (Si$_7$H$_{16}$).

9. The method of claim 7, wherein the silicon hydride represented by Formula (D) is selected from at least one of:
    cyclosilane (SiH$_2$),
    cyclodisilane (Si$_2$H$_4$),
    cyclotrisilane (Si$_3$H$_6$),
    cyclotetrasilane (Si$_4$H$_8$),
    cyclopentasilane (Si$_5$H$_{10}$),
    cyclohexasilane (Si$_6$H$_{12}$), and
    cycloheptasilane (Si$_7$H$_{14}$).

* * * * *